US009386642B2

(12) United States Patent
Notermans et al.

(10) Patent No.: US 9,386,642 B2
(45) Date of Patent: Jul. 5, 2016

(54) SEMICONDUCTOR DEVICE

(71) Applicant: NXP B.V., Eindhoven (NL)

(72) Inventors: Godfried Henricus Josephus Notermans, Hamburg (DE); Hans-Martin Ritter, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/704,768

(22) Filed: May 5, 2015

(65) Prior Publication Data

US 2015/0333119 A1 Nov. 19, 2015

(30) Foreign Application Priority Data

May 19, 2014 (EP) .................................... 14168907

(51) Int. Cl.
*H01L 29/06* (2006.01)
*H01L 29/861* (2006.01)
*H01L 29/732* (2006.01)
*H01L 29/74* (2006.01)
*H01L 27/02* (2006.01)
*H01L 49/02* (2006.01)
*H05B 33/08* (2006.01)
*H02M 7/217* (2006.01)
*H01L 29/87* (2006.01)

(52) U.S. Cl.
CPC ........ *H05B 33/0815* (2013.01); *H01L 27/0255* (2013.01); *H01L 27/0259* (2013.01); *H01L 27/0262* (2013.01); *H01L 27/0288* (2013.01); *H01L 28/20* (2013.01); *H01L 29/0638* (2013.01); *H01L 29/0684* (2013.01); *H01L 29/732* (2013.01); *H01L 29/74* (2013.01); *H01L 29/861* (2013.01); *H01L 29/87* (2013.01); *H02M 7/217* (2013.01)

(58) Field of Classification Search
CPC .......................... H01L 29/0638; H01L 29/732
See application file for complete search history.

(56) References Cited

U.S. PATENT DOCUMENTS

2007/0080403 A1 4/2007 Litfin et al.
2007/0210386 A1* 9/2007 Mori .................... G09G 3/2965
257/359
2011/0176243 A1 7/2011 Zhan et al.
(Continued)

OTHER PUBLICATIONS

Wikipedia, "Depletion region", 5 pgs.; retrieved from the Internet at (May 14, 2014): https:jjen.wikipedia.orgjwjindex. php?title=Depletion region&oldid=608476441 [retrieved on Oct. 9, 2015].

(Continued)

*Primary Examiner* — Duy T Nguyen
*Assistant Examiner* — Mounir Amer

(57) ABSTRACT

A semiconductor device (300a) comprising: a substrate (302) having a first surface (303); an n-type well (304) extending from the first surface (303) into the substrate (302) and configured to form a depletion region (306) in the substrate (302) around the n-type well (304); an insulating layer (340) extending over the first surface (303) of the substrate (302) from the n-type well (304), the insulating layer (340) configured to form an inversion layer (342) in the substrate (302) extending from the n-type well (304) adjacent to the first surface (303); wherein a p-type floating channel stopper (370a) is provided, configured to extend through the inversion layer (342) to reduce electrical coupling between the n-type well (304) and at least part of the inversion layer (342), and is electrically disconnected from a remainder of the substrate (320) outside of the depletion region (306).

19 Claims, 7 Drawing Sheets

(56) References Cited

U.S. PATENT DOCUMENTS

| | | | |
|---|---|---|---|
| 2012/0097980 A1* | 4/2012 | Masuda | H01L 29/0615 257/77 |
| 2012/0299164 A1* | 11/2012 | Nishimura | H01L 29/0619 257/656 |
| 2013/0134479 A1 | 5/2013 | Xu et al. | |
| 2014/0084373 A1 | 3/2014 | Huang | |

OTHER PUBLICATIONS

Extended European Search Report for EP Patent Appln. No. 14176616.2 (Oct. 20, 2015).

Sze, S.M. "The Physics of Semiconductor Devices, Chapter 4—Thyrstors", $2^{nd}$ edition, John Wiley & sons, New York, 15 pgs. (1981).

\* cited by examiner

SEMICONDUCTOR DEVICE

CROSS-REFERENCE TO RELATED APPLICATIONS

This application claims the priority under 35 U.S.C. §119 of European patent application no. 14168907.5, filed on May 19, 2014, the contents of which are incorporated by reference herein.

This disclosure relates to semiconductor devices such as semiconductor controlled rectifiers or thyristors, transistors, rectifiers, diodes and resistors, and relates to mechanisms for reducing the capacitance of such devices.

A first aspect of the invention provides a semiconductor device comprising: a substrate having a first surface; an n-type well extending from the first surface into the substrate and configured to form a depletion region in the substrate around the n-type well; an insulating layer extending over the first surface of the substrate from the n-type well, the insulating layer configured to form an inversion layer in the substrate extending from the n-type well adjacent to the first surface; wherein a p-type floating channel stopper is provided, configured to extend through the inversion layer to reduce electrical coupling between the n-type well and at least part of the inversion layer, and is electrically disconnected from a remainder of the substrate outside of the depletion region.

By reducing the electrical coupling between the inversion layer and the n-type well, the p-type floating channel stopper may advantageously reduce the capacitance of the semiconductor device. The provision of the p-type floating channel stopper, which by extending through the inversion layer advantageously reduces electrical coupling between the n-type well and the inversion layer may thereby reduce the capacitance of the device.

The p-type floating channel stopper may be in direct contact with the n-type well.

The p-type floating channel stopper may be separated from the n-type well.

Separating the floating channel stopper from the n-type well by a small gap, such as a gap of between 0.5 microns or 1 micron, may advantageously allow for a higher p-dopant concentration in the p-type floating channel stopper.

The p-type floating channel stopper may comprise a continuous structure surrounding the n-type well.

By surrounding the n-type well, the floating channel stopper may advantageously reduce the coupling between the n-type well and the inversion layer to a greater extent than if the floating channel stopper only partially surrounds the n-type well.

The semiconductor device may further comprise: a plurality of n-type wells; and a plurality of p-type floating channel stoppers; wherein each p-type floating channel stopper is disposed between a respective pair of n-type wells.

The semiconductor device may further comprise a p-type well extending from the first surface of the substrate, the insulating layer configured to extend between the n-type well and the p-type well such that the inversion layer extends between the n-type well and the p-type well.

In use, the n-type well may be configured to be coupled to a first positive voltage and the p-type well may be configured to be coupled to a second negative voltage.

In use, the p-type well may be configured to be coupled to electrical ground.

The semiconductor device may further comprise: a plurality of n-type wells; a plurality of p-type wells; and a plurality of p-type floating channel stoppers; wherein each p-type floating channel stopper may be disposed between a respective n-type well and a respective p-type well.

The p-type dopant concentration of the p-type well may be greater than the p-type dopant concentration of the p-type floating channel stopper.

The semiconductor device may comprise: a semiconductor controlled rectifier (thyristor); a transistor; a diode; or a diffused resistor.

The p-type floating channel stopper may be configured to split, electronically, the inversion layer into a first part connected to the n-type well and a second part disconnected from the n-type well.

The remainder of the substrate outside of the depletion region may be configured to be electrically grounded.

An electrostatic discharge protection device may comprise the semiconductor device.

An electronic device may comprise the electrostatic discharge protection device.

Examples of the invention will now be described in detail with reference to the accompanying figures, in which.

Figure 1A:
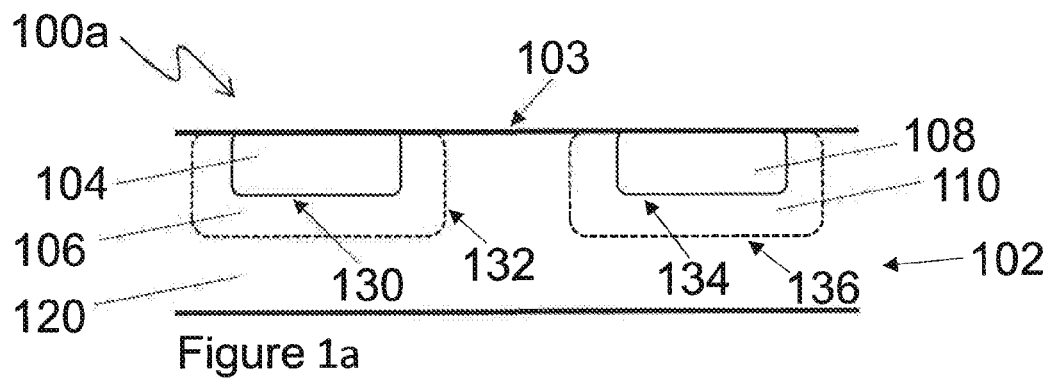
FIG. 1a shows a cross-section view of a semiconductor device comprising two independent n-type wells.
Figure 1B:
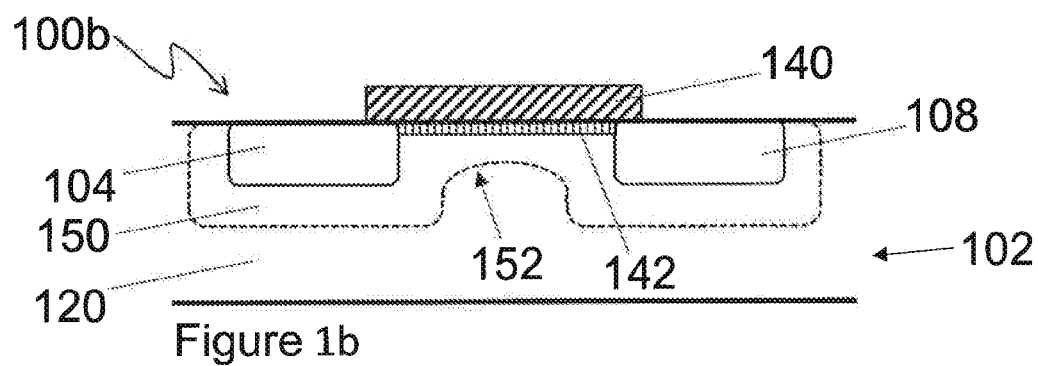
FIG. 1b shows a cross-section view of a semiconductor device comprising two n-type wells connected by an inversion layer.
Figure 1C:
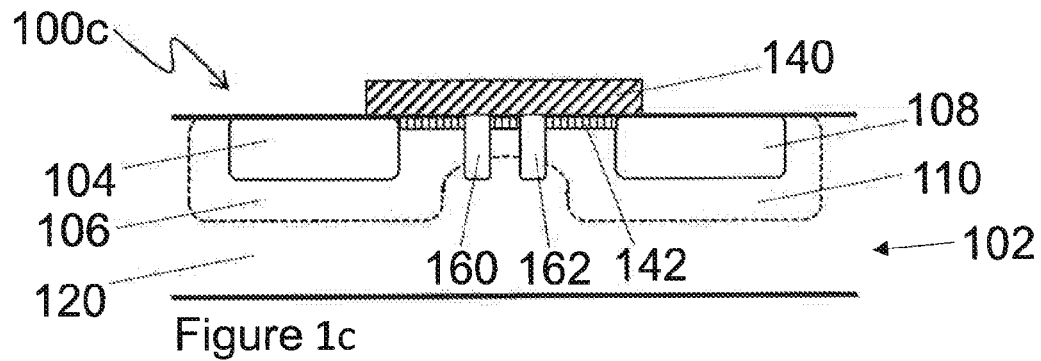
Figure 2:
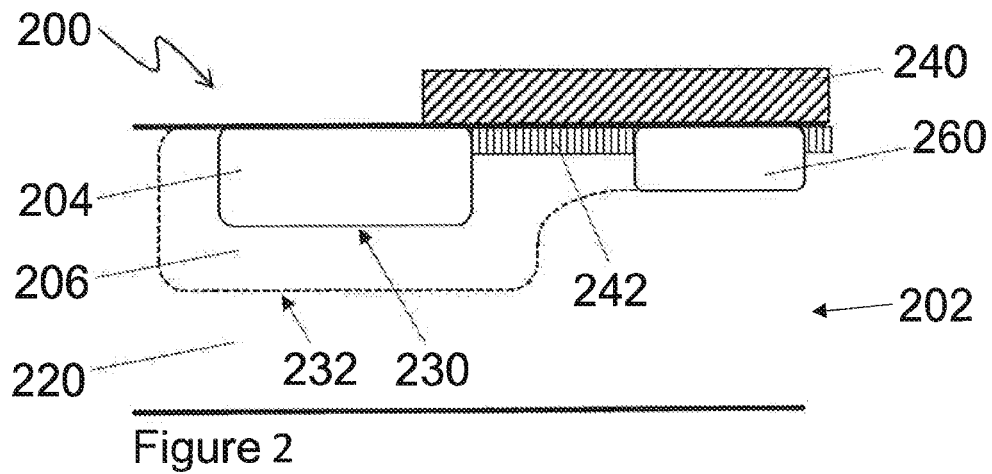
Figure 3A:
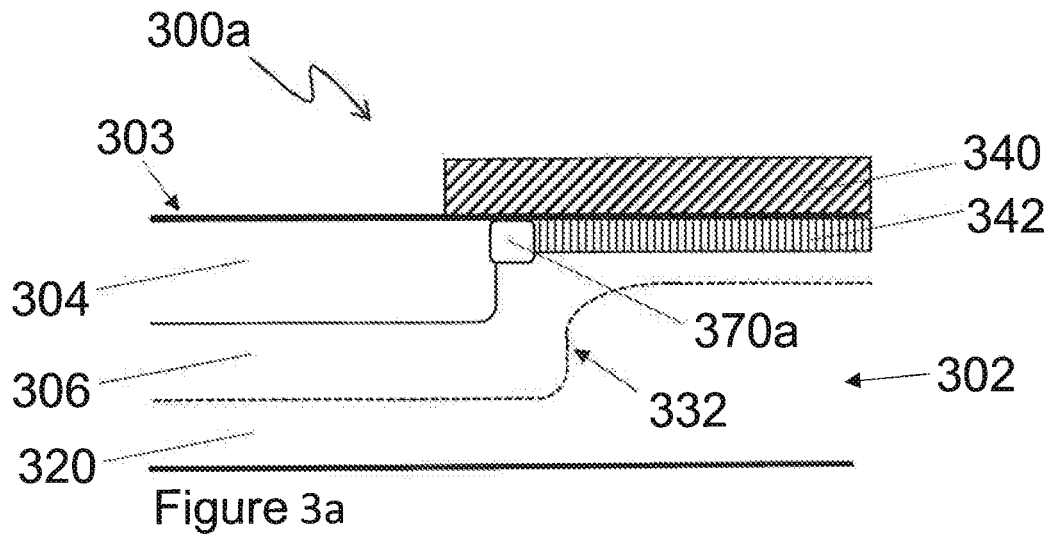
Figure 3B:
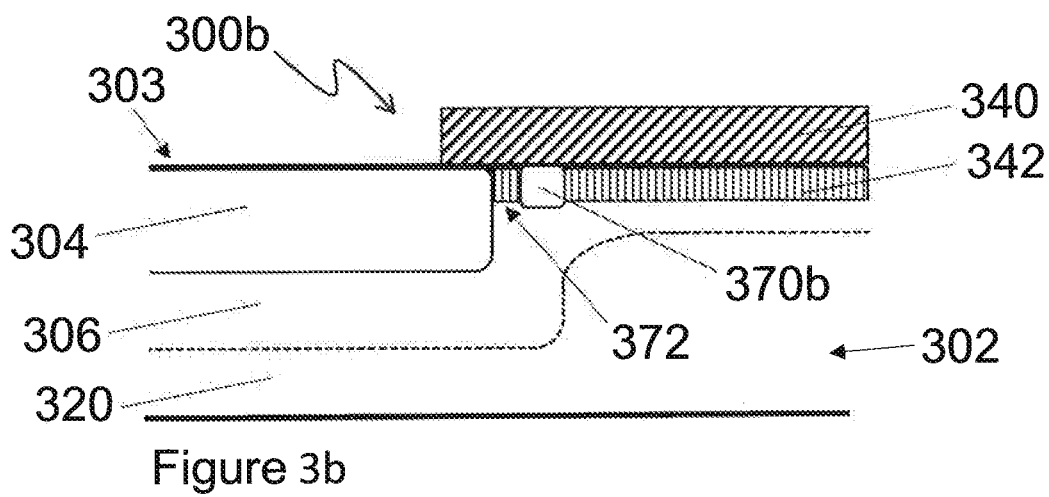
Figure 4:
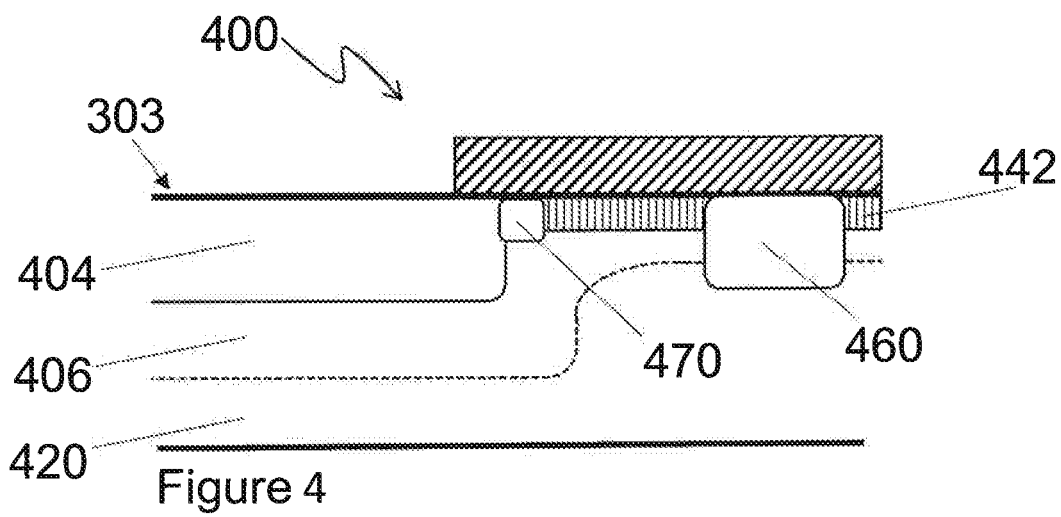
Figure 5A:
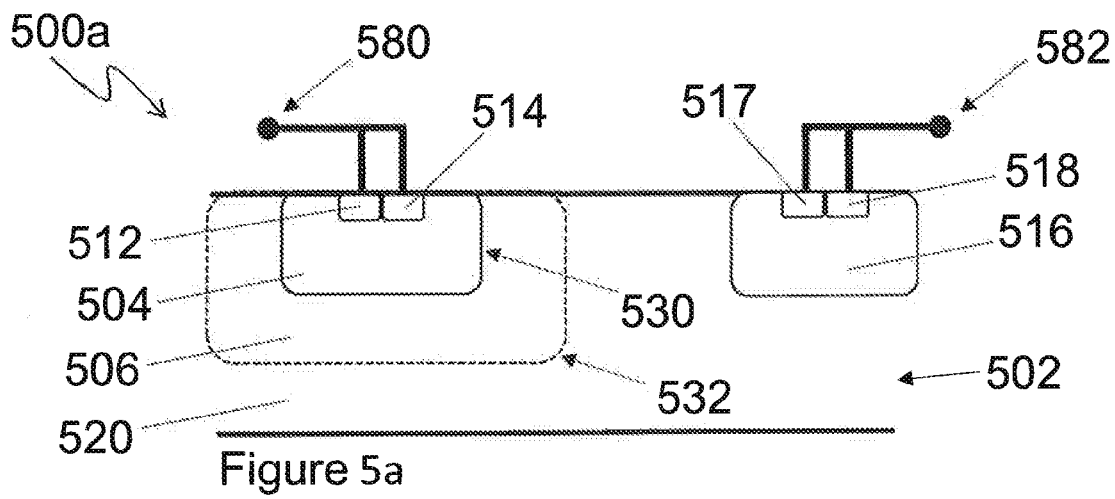
Figure 5B:
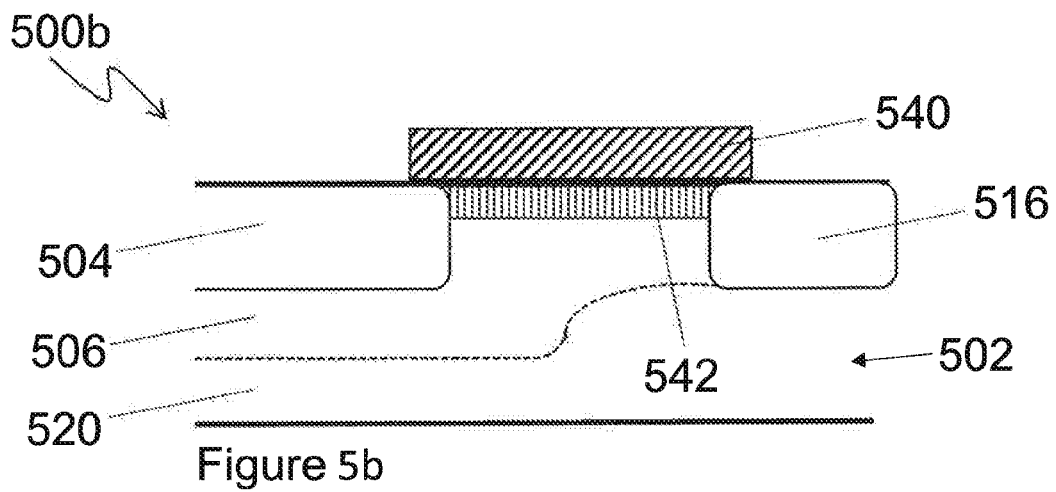
Figure 5C:
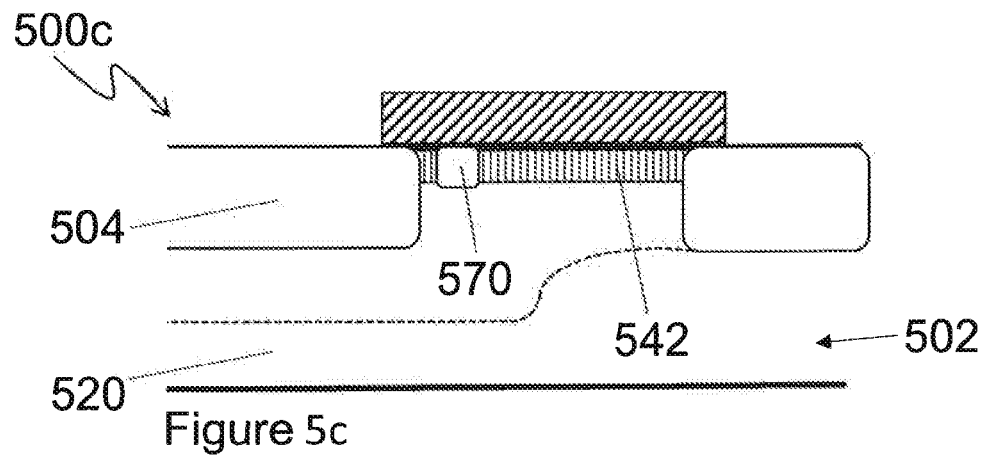
Figure 6:
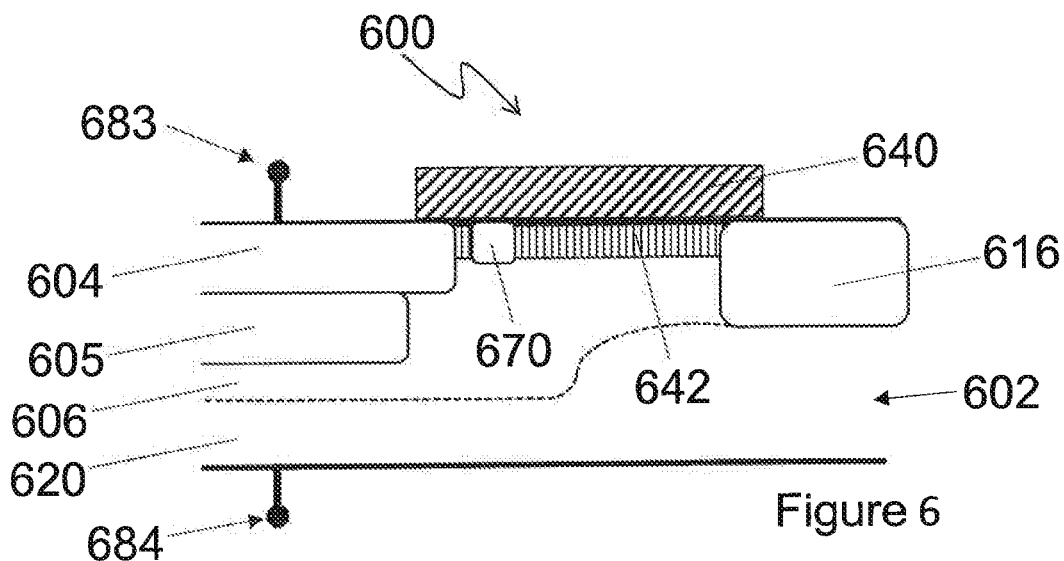
Figure 7:
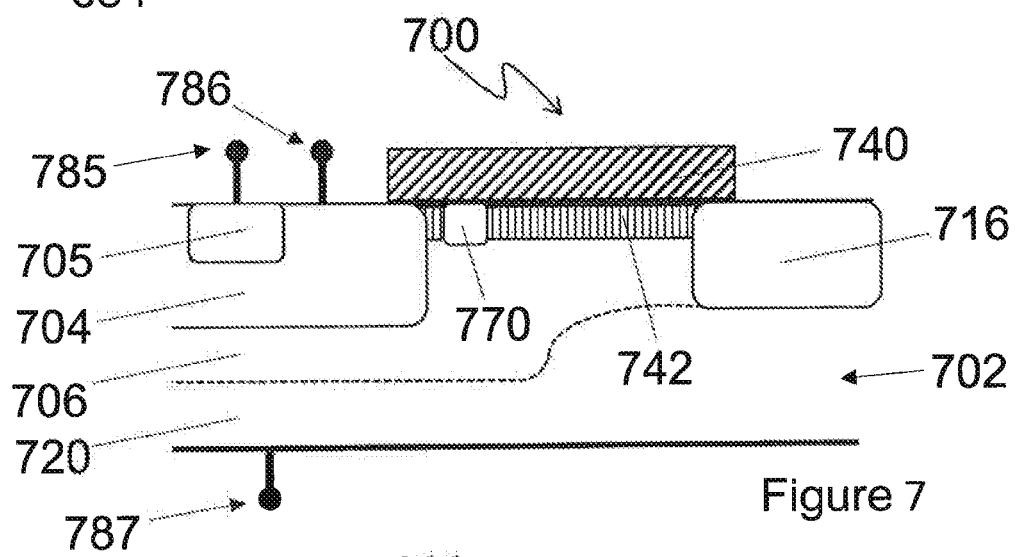
Figure 8:
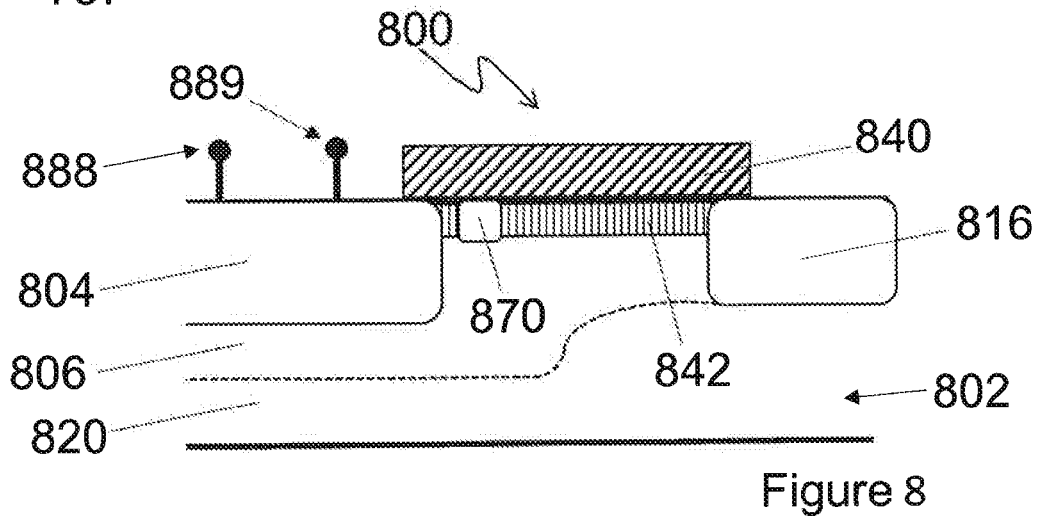
Figure 9:
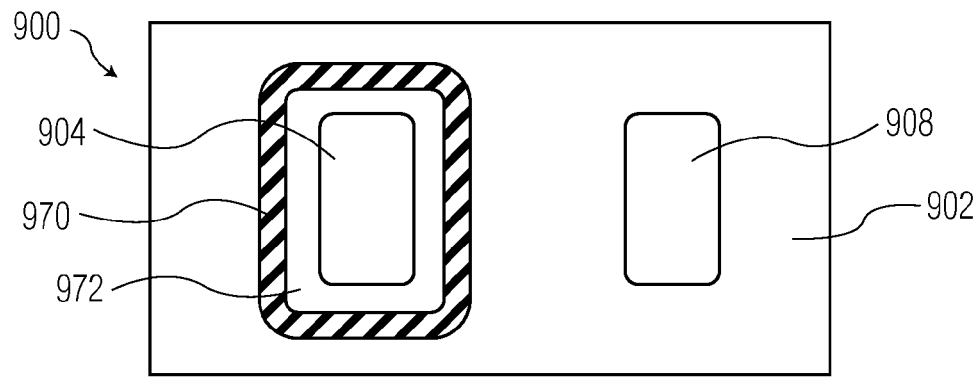
Figure 10A:
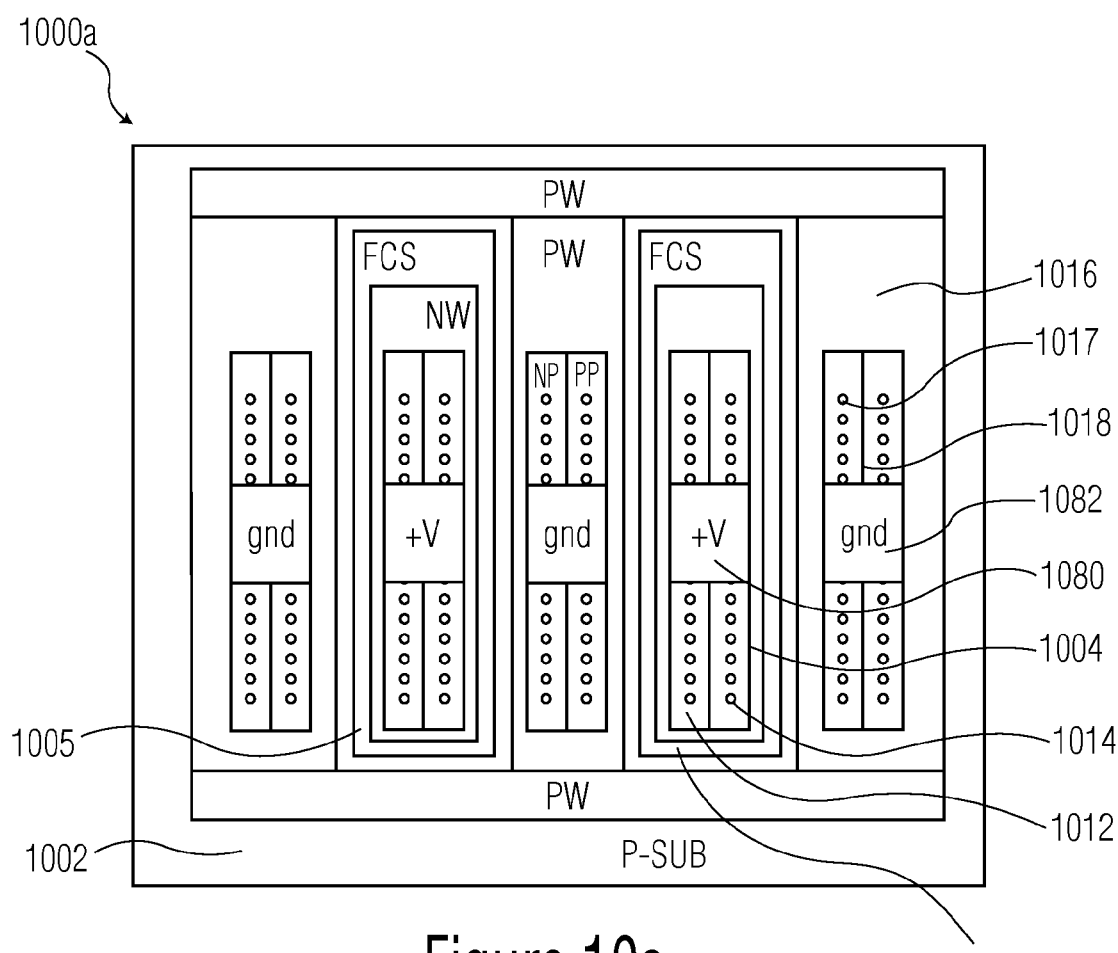
Figure 10B:
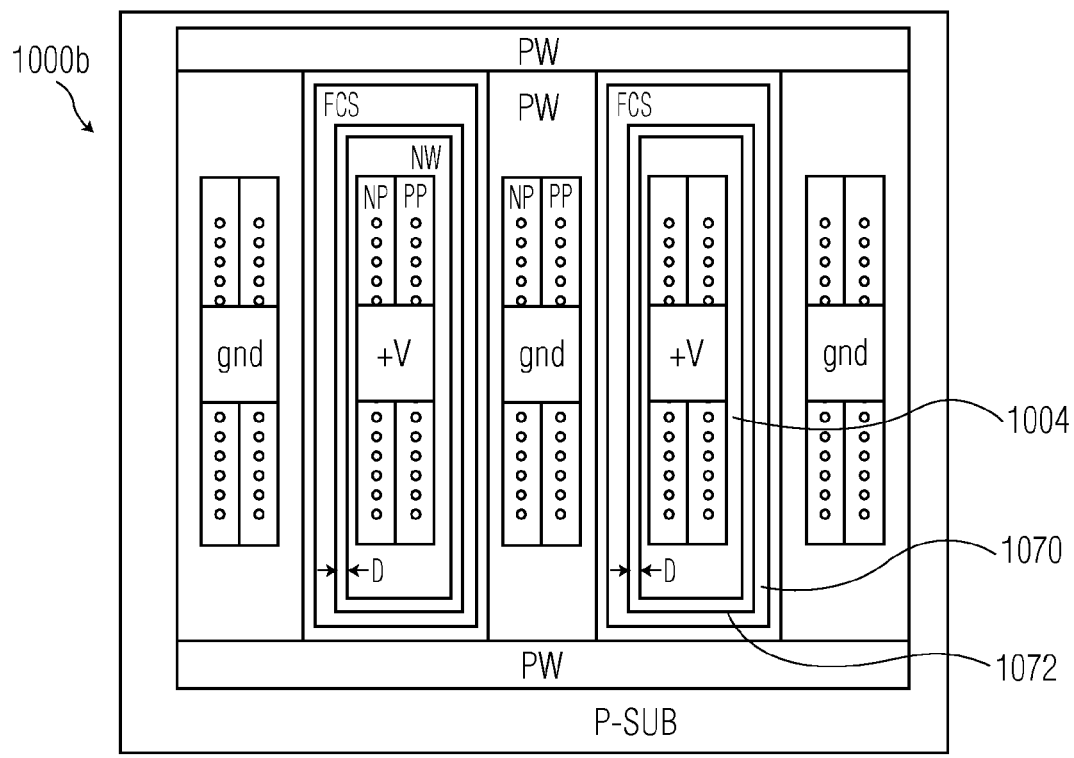
Figure 11A:
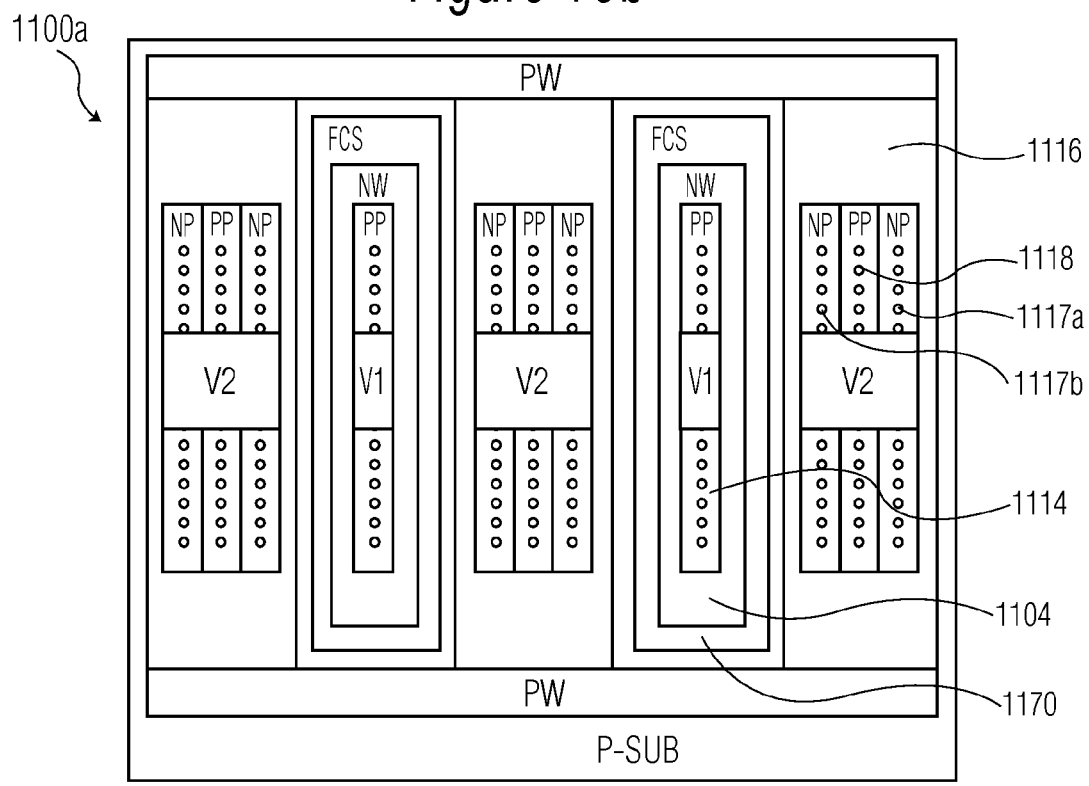
Figure 11B:
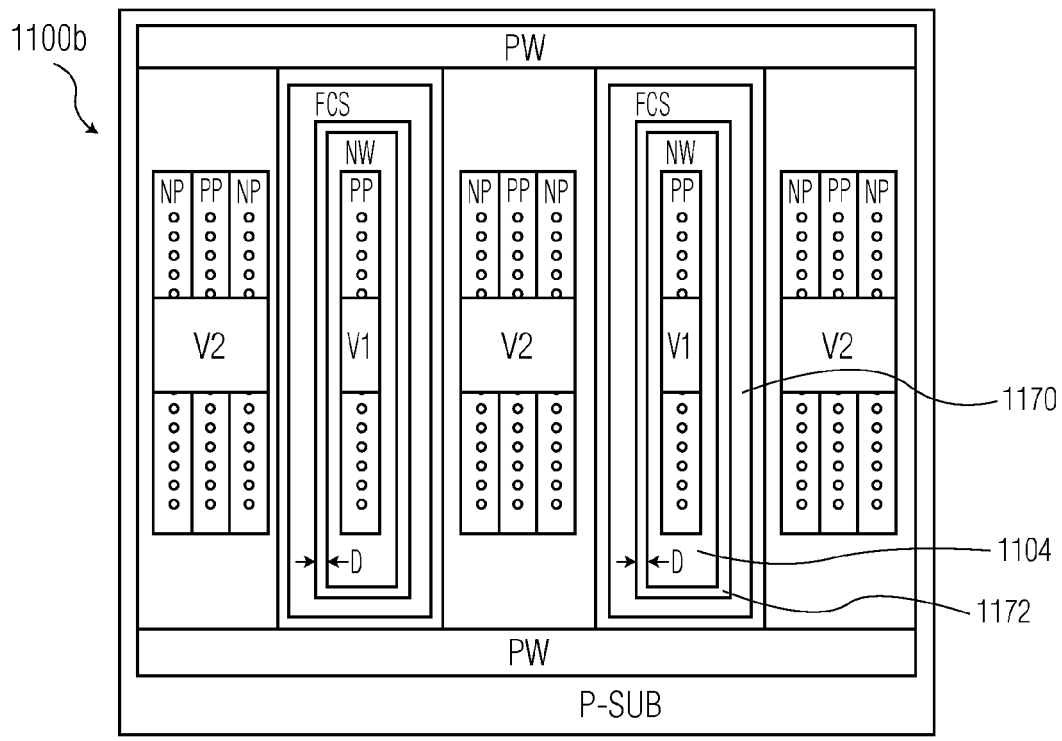
Figure 11C:
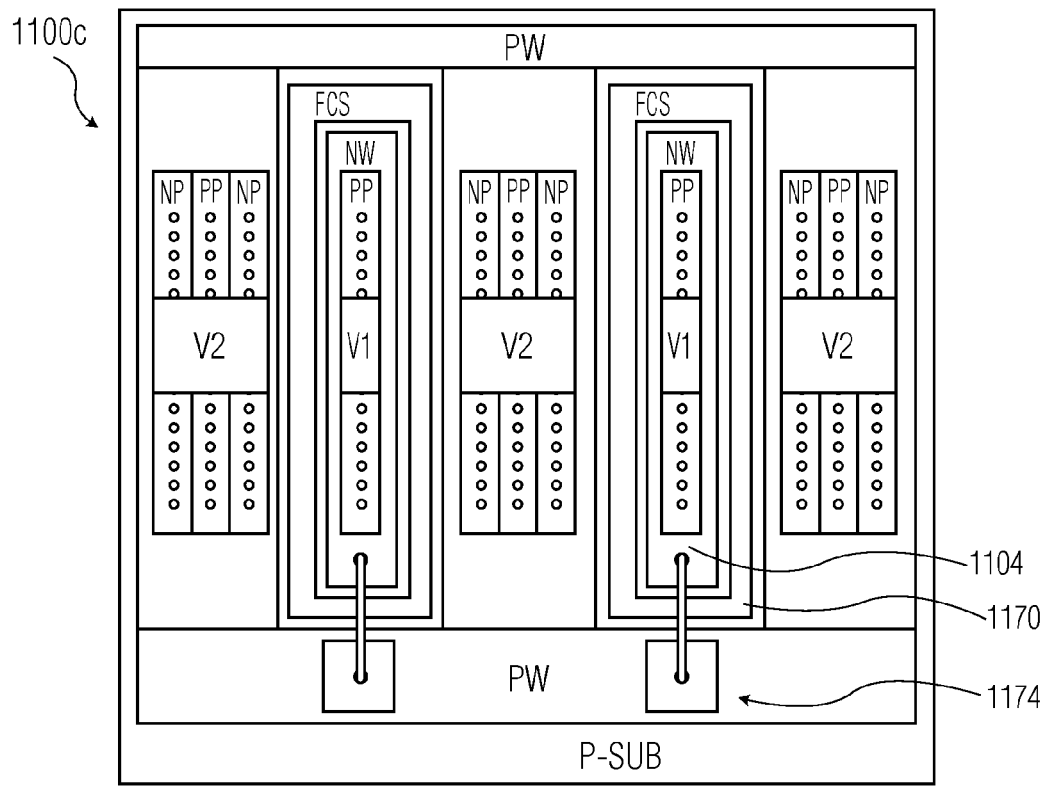

FIG. 1c: shows a cross-section view of a semiconductor device comprising two n-type wells and two p-type channel stoppers;

FIG. 2 shows a cross-section view of a semiconductor device comprising an n-type well and a p-type channel stopper;

FIG. 3a shows a cross-section view of a semiconductor device comprising an n-type well and a coterminous adjacent p-type floating channel stopper;

FIG. 3b shows a cross-section view of a semiconductor device comprising an n-type well and a spaced p-type floating channel stopper;

FIG. 4 shows a cross-section view of a semiconductor device comprising an n-type well, a floating channel stopper and a non-floating p-type channel stopper;

FIG. 5a shows a cross-section view of a semiconductor device comprising semiconductor controlled rectifier;

FIG. 5b shows a cross-section view of a semiconductor controlled rectifier comprising a non-floating p-type channel stopper;

FIG. 5c shows a cross-section view of a semiconductor controlled rectifier comprising a floating channel stopper and a non-floating p-type channel stopper;

FIG. 6 shows a cross-section view of a diode comprising a floating channel stopper;

FIG. 7 shows a cross-section view of a pnp-transistor comprising a floating channel stopper;

FIG. 8 shows a cross-section view of a diffused resistor comprising a floating channel stopper;

FIG. 9 shows a plan view of a semiconductor device comprising an n-type well surrounded by a floating channel stopper;

FIG. 10a shows a plan view of a semiconductor controlled rectifier, with an integrated return diode, comprising an n-type well surrounded by a coterminous floating channel stopper;

FIG. 10b shows a plan view of a semiconductor controlled rectifier, with an integrated return diode, comprising an n-type well surrounded by a spaced floating channel stopper;

FIG. 11a shows a plan view of a semiconductor controlled rectifier comprising an n-type well surrounded by a coterminous floating channel stopper;

FIG. 11b shows a plan view of a semiconductor controlled rectifier comprising an n-type well surrounded by a spaced floating channel stopper; and FIG. 11c shows a plan view of a semiconductor controlled rectifier comprising an n-type well surrounded by a spaced floating channel stopper and an external triggering circuit.

Semiconductor devices may comprise a substrate with additional layers of materials or components disposed on the substrate. The presence of different layers results in these devices having a significant capacitance. Previously, such devices might have had a capacitance of 1 pF. For high-frequency applications, such as high speed communications systems like Universal Serial Bus (USB) 3.0 or 3.1, it may be advantageous to use integrated circuit devices that have low capacitance. Increasingly, it is desirable to have devices with a capacitance of 250 fF or less. Reductions in the capacitance of a device may be achieved by making the device physically smaller.

One application of a semiconductor device is to provide Electrostatic Discharge (ESD) protection devices. Previously, such devices may have provided ESD protection up to 8 kV contact discharge. However, it is increasingly desirable to provide ESD performance to even higher voltages, such as 15 kV or 25 kV or more. This can be achieved by making the devices physically larger.

These two conflicting requirements, to make devices larger to improve their ESD performance but to make devices smaller to reduce their capacitance, demand innovative solutions that enable high ESD performance while maintaining low capacitance.

FIG. 1a shows a cross-section view of a semiconductor device 100a which comprises a p-type substrate 102 having a first surface 103, a first n-type well 104 extending into the substrate 102 from the first surface 103 and having an associated first depletion region 106, and a second n-type well 108 extending from the first surface 103 with a second associated depletion region 110. The first 104 and second 108 n-type wells are electrically isolated from each other. A grounded portion 120 of the substrate 102 is coterminous with the first 106 and second 110 depletion regions. In use, the grounded portion 120 may be connected to electrical ground. The device 100 may have a capacitance that may be considered to comprise, to a certain approximation, the equivalent of a parallel plate capacitance between the boundary 130 of the first n-type well 104 and the boundary 132 of the first depletion region 106. A further capacitance may arise between the boundary 134 of the second n-type well 108 and the boundary 136 of the second depletion region 110.

To ensure that the capacitance of the device 100a is as low as possible it is necessary to configure the device 100a to have as wide a depletion region as possible; this may be achieved by using a p-type substrate 102 with a low dope concentration. For example, in order to achieve an overall capacitance of 250 fF, for a complete device including metallization stack and package (which may have a capacitance of 100 fF) the substrate dope concentration may be approximately $10^{14}$ cm$^{-3}$. One problem that may arise using such low substrate dope concentrations is that an oxide layer disposed on the surface of the substrate, even with a very low level of oxide charge such as $3\times10^{10}$ cm$^{-2}$, may cause the formation of an inversion layer in the substrate below the oxide layer. The presence of the inversion layer may increase the capacitance of the device as disclosed below.

FIG. 1b shows a cross-section view of a semiconductor device 100b similar to the device 100a of FIG. 1a, wherein an oxide layer 140 has been disposed on top of the substrate 102. The presence of the oxide layer 140 may cause an inversion layer 142 to develop within a thin portion of the substrate 102. The inversion layer 142 provides an electrical connection between the first 104 and second 108 n-type wells, which are consequently no longer electrically isolated from each other. The inversion layer 142, therefore, effectively extends the n-type region continuously from the first n-type region 104 to the second n-type region 108. Consequently, a combined depletion region 150 may form. The boundary 152 of the combined depletion region 150 may be considered to form one plate of a parallel plate capacitor arrangement, with the other plate comprising the boundaries 132, 134 of the first 104 and second 108 n-type wells together with the inversion layer 142. The greater area of these boundaries may disadvantageously provide an increased capacitance of the device 100b over that of the device 100a of FIG. 1a. A further disadvantage of this device 100b may be an increase in leakage current between the first 104 and second 108 n-type wells over that of the device 100a of FIG. 1a.

Simulations and measurements have shown that an inversion layer may increase the capacitance of a typical device by about 22 fF per micron width of the inversion layer, for typical values of device size and oxide charge level. This may provide a significant disadvantage when seeking to design a device with an overall capacitance of 250 fF or less.

FIG. 1c shows a cross-section view of a semiconductor device 100c similar to the device 100b shown in FIG. 1b. The device 100c further comprises a first p-type well 160 and a second p-type well 162 situated between the first n-type region 104 and the second n-type region 108. The p-type well 160 will be discussed in more detail below in relation to FIG. 2.

FIG. 2 shows an enlargement of the left side of FIG. 1c. Features in FIG. 2 that are similar to features in FIGS. 1a, 1b and 1c have been given corresponding reference numerals and will not necessarily be described here to assist in the clarity of the disclosure.

In addition to an n-type well 204, the device 200 has a p-type well 260. The p-type well 260 is situated below the oxide layer 240 and is configured to disrupt the inversion layer 242. This disruption of the inversion layer 242 acts to reduce the extent of the depletion region 206 and therefore the extent of the boundary 232 between the depletion region and the grounded portion 220 of the substrate 202. The reduction in the extent of the boundary 232 of the depletion region 206 may result in a reduction of the capacitance of the device. It is noteworthy that the p-type well 260 also disrupts the extent of the depletion region 260 such that the p-type well 260 is grounded by being in electrical contact with the grounded portion 220 of the substrate 202.

FIG. 3a shows a cross-section view of a semiconductor device 300a according to an inventive concept that may reduce the capacitance and leakage current associated with device shown in FIGS. 1b and 1c. Features in FIG. 3 that are similar to features in previous figures have been given corresponding reference numerals and will not necessarily be described here to assist in the clarity of the disclosure.

The device 300a comprises a floating channel stopper 370a disposed in the substrate 302 in a position between an n-type well 304 and an inversion layer 342. The floating channel stopper 370a is in contact with the n-type well 304 but is not in contact with the grounded portion 320 of the substrate, because it is fully embedded in the depletion region. Consequently, the floating channel stopper 370a is not itself grounded, rather its electrical potential is floating with respect to the ground. The floating channel stopper 370a is configured to disrupt the inversion layer 342 such that electrical coupling between the n-type well 304 and the inversion layer 342 is significantly reduced. The charge in the inversion layer 342 will only be indirectly coupled to the charge in the n-type well 304 via the n-type well—floating channel stopper capacitance and the floating channel stopper—inversion layer capacitance, which may be very small compared to the direct coupling that may occur in the absence of a floating channel stopper 370a.

The de-coupling of the n-type well 304 from the inversion layer 342 may result in a significant reduction in the capacitance of the device 300a relative to a device lacking such a floating channel stopper 370a. This reduction arises because the inversion layer 342 no longer serves to extend the n-type well 304 across the substrate 302 and therefore reduces the effective area of the equivalent parallel plate capacitor coupled to the n-type well 304.

The floating channel stopper 370a may extend substantially wholly through the inversion layer. The inversion layer typically has a depth of less than 5 nm and the floating channel stopper 370a may have a depth of between 0.1 µm and 0.5 µm.

It will be appreciated that a second floating channel stopper (not shown) may be disposed adjacent to a second n-type well (not shown) in a device similar to that shown in FIG. 1b. The presence of these floating channel stoppers may effectively isolate the inversion layer from both n-type wells, thereby advantageously reducing the magnitude of the capacitance of the overall arrangement.

Simulation analysis has shown that a range of appropriate doping concentrations exists for the floating channel stopper, in which the floating channel stopper is p-doped. The simulations show that overall capacitance remains essentially unchanged until the concentration of p-dopant in the floating channel stopper reaches approximately $10^{19}$ cm$^{-3}$. Above this level of concentration, the overall capacitance starts to increase significantly, because the floating channel stopper starts to over-dope the depletion layer around the n-type well; this results in the floating channel stopper becoming progressively better connected to the grounded portion of the p-type substrate as the concentration increases. When the floating channel stopper is sufficiently highly doped it will no longer be floating relative to the grounded portion of the substrate and then the n-type well—floating channel stopper capacitance will be added to the total capacitance causing an overall increase in the capacitance of the device. Therefore, an advantageous level of doping for a floating channel stopper may be approximately $10^{18}$ cm$^{-3}$, or may be less than $10^{18}$ cm$^{-3}$, or may be less than $10^{17}$ cm$^{-3}$.

The extent of the benefit of using a floating channel stopper will depend on the amount of oxide charge included in the device. In modern complementary metal-oxide-semiconductor (CMOS) fabrication plants, the amount of oxide charge may be limited to about $6 \times 10^{10}$ cm$^{-2}$; simulations suggest that at this level a floating channel stopper may reduce the capacitance of the device by about 20 fF. However, in older fabrication plants the oxide charge may be several times $10^{11}$ cm$^{-2}$ and simulations have shown that the reduction in capacitance may be approximately 100 fF.

FIG. 3b shows a cross-section view of a semiconductor device 300b similar to the device 300a shown in FIG. 3a. Features in FIG. 3b that are similar to features in previous figures have been given corresponding reference numerals and will not necessarily be described here to assist in the clarity of the disclosure.

The device 300b comprises a floating channel stopper 370b that is disposed between the inversion layer 342 and the n-type well 304, but which is not in contact with the n-type well 304. The floating channel stopper 370b is disposed such that there is a small gap 372 between the floating channel stopper 370b and the n-type well 304. The gap 372 may enable the use of a floating channel stopper with a higher doping concentration than $10^{19}$ cm$^{-3}$. The gap 372 may be approximately 0.5 microns; a gap 372 greater than 1 micron does not appear to provide any additional benefit. Thus the gap may be substantially less than 1.5 microns, 1.25 microns or 1 micron. The substrate 302 extends to the first surface 303 in the region between the floating channel stopper 370b and the n-type well 304.

FIG. 4 shows a cross-section view of a semiconductor device 400 similar to the device 300a shown in FIG. 3a. Features in FIG. 4 that are similar to features in previous figures have been given corresponding reference numerals and will not necessarily be described here to assist in the clarity of the disclosure.

The device 400 comprises a floating channel stopper 470 and a non-floating channel stopper 460. Both types of channel stopper may be used in the same device. It will be appreciated that, in order to remain at a floating potential relative to ground, the floating channel stopper 470 must remain of a sufficiently small size so as not to perturb the extent of the depletion region 406 in such a way as to allow direct contact (not shown) between the floating channel stopper 470 and the grounded portion 420 of the substrate 402. If direct contact is made between them, then the floating channel stopper 470 would effectively become a non-floating channel stopper similar to the channel stopper 460.

FIG. 5a shows a cross-section view of a semiconductor controlled rectifier (SCR) 500a. SCR's may be used as one type of ESD device that have a particularly high ESD performance per unit area.

The SCR 500a comprises: a substrate 502; an n-type well 504 disposed on the substrate 502; an n+ diffusion 512 within the n-type well 504; a p+ diffusion 514 within the n-type well 504; a p-type well 516 disposed on the substrate 502; an n+ diffusion 517 within the p-type well 516; and a p+ diffusion 518 within the p-type well 516. The presence of the n-type well 504 causes a depletion region 506 to form in the substrate 502. Outside of the depletion region 506 is a grounded portion 520 of the substrate 502. The boundary 530 of the n-type well 504, together with the boundary 532 of the depletion region 506 may be considered equivalent to the plates of a parallel plate capacitor. The SCR 500a also comprises: a first electrical terminal 580 connected to the n+ diffusion 512 and the p+ diffusion 514 within the n-type well 504; and a second electrical terminal 582 connected to the n+ diffusion 517 and the p+ diffusion 518 within the p-type well 516. In use, the first terminal 580 is configured to be held at a positive voltage relative to the second terminal 582. The SCR will trigger once the voltage across the junction between the n-type well 504 and the substrate 520 exceeds a threshold corresponding to the breakdown voltage of the device 500a.

It will be appreciated that, if the second electrical terminal 582 is held at a positive voltage with respect to the first electrical terminal 580, then the SCR 500a will operate as a regular diode for current flowing from the p+ diffusion 518 in the p-type well 516 to the n+ diffusion 512 in the n-type well 504. The SCR 500a may therefore be said to comprise an integrated return diode.

FIG. 5b shows a cross-section view of an SCR 500b similar to the device 500a shown in FIG. 5a. Features in FIG. 5b that are similar to features in previous figures have been given corresponding reference numerals and will not necessarily be described here to assist in the clarity of the disclosure. Other features, such as the first and second electrical contacts have not been shown to aid the clarity of the disclosure.

An SCR may include an oxide layer 540 disposed on top of the substrate 502. Presence of the oxide layer may cause the formation of an inversion layer 542, as discussed above in relation to FIG. 1b. The inversion layer 542 will effectively extend the n-type well 504 across to the p-type well 516. This extension will increase the capacitance of the device, as discussed above in relation to FIG. 1b.

FIG. 5c shows a cross-section view of an SCR 500c similar to the device 500b shown in FIG. 5b. Features in FIG. 5c that are similar to features in previous figures have been given corresponding reference numerals and will not necessarily be described here to assist in the clarity of the disclosure.

The SCR 500c comprises a floating channel stopper 570 disposed adjacent to, but not in contact with, the n-type well 504. The floating channel stopper 570 is configured to disrupt the inversion layer 542, but is also configured to remain separate from the grounded portion 520 of the substrate 502, its electrical potential thereby floats with respect to the ground. By disrupting the inversion layer 542, the floating channel stopper 570 reduces the coupling between the n-type well 504 and the inversion layer 542, as described above in relation to FIGS. 3a and 3b, and thereby reduces the capacitance of the device 500c. It is important to note that, while the floating channel stopper 570 reduces the capacitance of the device 500c, it does not reduce the ESD performance of the device 500c because its electrical potential floats relative to the ground. The presence of the floating channel stopper 570 in the device 500c therefore advantageously enables the device to maintain high ESD performance and low capacitance simultaneously.

It will be appreciated that the SCR 500c could also be configured with a floating channel stopper in direct contact (not shown) with the n-type well 504.

FIG. 6 shows a cross-section view of a semiconductor device comprising a diode 600. The diode 600 comprises a cathode 683 coupled to an n-type well 604, a first p-type well 605 in direct contact with the n-type well 604, wherein both the n-type well 604 and the first p-type well 605 are disposed within a p-type substrate 602. The p-type substrate 602 comprises a depletion region 606 and coterminous with at least a portion of the depletion region an electrically grounded region 620. The electrically grounded region 620 is coupled to an anode 684. The depletion region 606 extends to a second p-type well 616. An oxide layer 640 disposed on top of the substrate 602 causes the formation of an inversion layer 642. A floating channel stopper 670 is disposed within the depletion region between the n-type well 604 and the second p-type well 616 and is configured to disrupt the inversion layer 642 such that the electrical coupling of the n-type well 604 and the inversion layer 642 is reduced. This reduction in electrical coupling may advantageously provide a reduction in the capacitance of the diode 600.

It will be appreciated that the diode 600 may be configured to form part of an ESD protection device. It will be further appreciated that the diode may be an avalanche diode.

FIG. 7 shows a cross-section view of a semiconductor device comprising a pnp-transistor 700. The transistor 700 comprises an emitter terminal 785 coupled to a p+ diffusion 705, wherein the p+ diffusion 705 is disposed within an n-type well 704. The n-type well 704, disposed on a p-type substrate 702, is coupled to a base terminal. The p-type substrate comprises a depletion region 706 proximal to the n-type well 704 and extending to a p-type well 716. The depletion region 706 is coterminous with an electrically grounded portion 720 of the substrate 702 that is coupled to a collector terminal 787. An oxide layer 740 disposed on top of the substrate 702 causes the formation of an inversion layer 742.

A floating channel stopper 770 is disposed within the depletion region, between the n-type well 704 and the p-type well 716 and is configured to disrupt the inversion layer 742 such that the electrical coupling between the inversion layer 742 and the n-type well 704 is reduced. This reduction in electrical coupling may advantageously provide a reduction in the capacitance of the transistor 700.

It will be appreciated that the transistor 700 may be configured to form part of an ESD protection device. It will be further appreciated that other transistors may advantageously include a floating channel stopper to reduce their capacitance, for example, a grounded-gate n-type metal-oxide-semiconductor field-effect (nMOS) transistor (not illustrated) may advantageously comprise a floating channel stopper.

FIG. 8 shows a cross-section view of a semiconductor device comprising a diffused resistor 800. The resistor 800 comprises an n-type well 804 coupled to a first electrical terminal 888 and coupled to a second electrical terminal 889. Features similar to those of FIG. 7 have been given corresponding reference numerals and may not be described further in order to improve the clarity of the disclosure.

In use, the resistor 800 is configured to have a potential difference applied between the first terminal 888 and the second terminal 889, such that an electrical current may flow between the terminals depending on the resistance of the device. The presence of a floating channel stopper 870 within the resistor 800 may advantageously reduce the capacitance of the resistor 800.

It will be appreciated that the resistor 800 may be configured to form part of an ESD protection device, or may be configured to form a resistive element within any other semiconductor device.

FIG. 9 shows a plan view of a semiconductor device 900 comprising a substrate 902, an n-type well 904, a second well 908, and a floating channel stopper 970. The second well 908 may be an n-type well or may be a p-type well. The floating channel stopper 970 completely surrounds the n-type well 904 around the surface of the substrate. The floating channel stopper 970 therefore serves to decouple the n-type well 904 from the inversion layer (not shown) that may be present across the device 900 outside of the area enclosed by the floating channel stopper 970. The device 900 comprises a gap 972 between the n-type well 904 and the floating channel stopper 970. It will be appreciated that, alternatively, the floating channel stopper 970 may be in direct contact (not shown) with the n-type well 904. It will be further appreciated that the floating channel stoppers disclosed above, in relation to FIGS. 3a, 3b, 4, 5c, 6, 7 and 8, may also form a continuous structure that encloses their respective n-type wells when considered in plan view.

FIG. 10a shows a plan view of an ESD protection device 1000a comprising an SCR. The device 1000a comprises a p-type substrate 1002 with an n-type well 1004 and a p-type well 1016. An n+ diffusion 1012 and a p+ diffusion 1014 are situated within the n-type well 1004. An n+ diffusion 1017 and a p+ diffusion 1018 are situated within the p-type well 1016. A first electrical terminal 1080 is connected to the n+ diffusion 1012 and the p+ diffusion 1014 in the n-type well 1004. A second electrical terminal 1082 is connected to the n+ diffusion 1017 and the p+ diffusion 1018 in the p-type well 1016.

The n-type well 1004 is surrounded by a floating channel stopper 1070 in the form of a continuous loop. The floating channel stopper 1070 is in direct contact with the n-type well 1004. The presence of the floating channel stopper 1070 serves to reduce the capacitance of the device without prejudicing the electrostatic discharge performance of the device.

It will be appreciated that the ESD performance may be increased by increasing the width of the n-type well 1004. In FIG. 10*a*, this corresponds to an increase in the extent of the n-type well 1004 in the vertical direction. Alternatively, the ESD performance may be increased by adding additional n-type wells to the device. In FIG. 10*a* an additional n-type well 1005 is illustrated. It will be appreciated that a plurality of n-type wells and p-type wells may be included in a device in order to meet a particular ESD performance target. The presence of floating channel stoppers, surrounding each n-type well, in the device will serve to reduce the capacitance of the device.

FIG. 10*b* show a plan view of an ESD protection device 1000*b* similar to that disclosed above in relation to FIG. 10*a*. The device 1000*b* has a gap 1072 between the n-type well 1004 and the floating channel stopper 1070. It will be appreciated that, as in the disclosure relating to FIG. 5, the configuration of both n+ and p+ diffusions in both the n-type well 1004 and the p-type well 1016 provides both devices disclosed in relation to FIG. 10*a* 1000*a* and FIG. 10*b* 1000*b* with integrated return diodes.

FIG. 11*a* shows a plan view of an ESD protection device 1100*a* similar to the device 1000*a* disclosed in relation to FIG. 10*a*. The device 1100*a* comprises an n-type well 1104 containing a p+ diffusion 1114, and a p-type well 1116 containing a first p+ diffusion 1117*a*, a second p+ diffusion 1117*b* and an n+ diffusion 1118. The n-type well 1104 is surrounded by a floating channel stopper 1170 in direct contact with the n-type well 1104. It will be appreciated that this configuration of n+ and p+ diffusions does not provide the device with any integrated return diodes; the device 1100*a* comprises an SCR only.

FIG. 11*b* shows a plan view of an ESD protection device 1100*b* similar to the device 1100*a* disclosed in relation to FIG. 11*a*. The device 1100*b* is configured to comprise a gap 1172 between the n-type well 1104 and the floating channel stopper 1170.

FIG. 11*c* shows a plan view of an ESD protection device 1100*c* similar to the device 1100*b* disclosed in relation to FIG. 11*b*. The device 1100*c* comprises an external trigger circuit 1174 coupled to the n-type well 1104. The external trigger circuit allows the SCR triggering voltage to be lowered to a desired level. It will be appreciated by persons skilled in the art that a variety of different triggering devices may be included within the device 1100*c*, such as for example an avalanche diode or stack of forward-biased diodes.

The n-type well 1104 is surrounded by a floating channel stopper 1170 that is configured to reduce the capacitance of the device 1100*c* without reducing the ESD performance of the device 1100*c*

The present invention may be useful in any semiconductor device comprising a standalone ESD protection device. It will provide the greatest advantages in devices that require extremely low capacitance, such as below 250 fF or below 150 fF, together with high ESD performance, such as above 15 kV or above 25 kV. Examples of systems that require such performance include high speed communications systems such as USB 3.0, USB 3.1 or Mobile High-Definition Link systems.

The present invention may also be used advantageously to lower the capacitance of other semiconductor devices for other high speed applications.

It will be appreciated that an integrated circuit may comprise any of the semiconductor devices disclosed herein.

The invention claimed is:

1. A semiconductor device comprising:
 a substrate having a first surface;
 an n-type well extending from the first surface into the substrate and configured to form a depletion region in the substrate around the n-type well;
 an insulating layer extending over the first surface of the substrate from the n-type well, the insulating layer configured to form an inversion layer in the substrate extending from the n-type well adjacent to the first surface; wherein
 a p-type floating channel stopper is provided, configured to extend through the inversion layer to reduce electrical coupling between the n-type well and at least part of the inversion layer, and is electrically disconnected from a remainder of the substrate outside of the depletion region.

2. The semiconductor device of claim 1, wherein the p-type floating channel stopper is in direct contact with the n-type well.

3. The semiconductor device of claim 1, wherein the p-type floating channel stopper is separated from the n-type well.

4. The semiconductor device of any preceding claim, wherein the p-type floating channel stopper comprises a continuous structure surrounding the n-type well.

5. The semiconductor device of claim 1, further comprising:
 a plurality of n-type wells; and
 a plurality of p-type floating channel stoppers;
 wherein each p-type floating channel stopper is disposed between a respective pair of n-type wells.

6. The semiconductor device of claim 1, further comprising a p-type well extending from the first surface of the substrate, the insulating layer configured to extend between the n-type well and the p-type well such that the inversion layer extends between the n-type well and the p-type well.

7. The semiconductor device of claim 6, wherein, in use, the n-type well is configured to be coupled to a first positive voltage and the p-type well is configured to be coupled to a second negative voltage.

8. The semiconductor device of claim 7, wherein, in use, the p-type well is configured to be coupled to electrical ground.

9. The semiconductor device of claim 6, further comprising:
 a plurality of n-type wells;
 a plurality of p-type wells; and
 a plurality of p-type floating channel stoppers;
 wherein each p-type floating channel stopper is disposed between a respective n-type well and a respective p-type well.

10. The semiconductor device of claim 6, wherein the p-type dopant concentration of the p-type well is greater than the p-type dopant concentration of the p-type floating channel stopper.

11. The semiconductor device of claim 1, comprising:
 a) a semiconductor controlled rectifier or thyristor;
 b) a transistor;
 c) a diode;
 d) a diffused resistor.

12. The semiconductor device of claim 1, wherein the p-type floating channel stopper is configured to split, electronically, the inversion layer into a first part connected to the n-type well and a second part disconnected from the n-type well.

13. The semiconductor device of claim 1, wherein the remainder of the substrate outside of the depletion region is configured to be electrically grounded.

14. An electrostatic discharge protection device comprising the semiconductor device of claim 1.

15. An electronic device comprising the electrostatic discharge protection device of claim 14.

16. The semiconductor device of claim 1, wherein the reduction in the electrical coupling between the n-type well and the inversion layer reduces a capacitance of the semiconductor device.

17. The semiconductor device of claim 1, wherein a charge in the inversion layer is indirectly coupled to a charge in the n-type well via the n-type well.

18. The semiconductor device of claim 1, wherein the reduction in the electrical coupling between the n-type well and the inversion layer reduces a capacitance of the semiconductor device without reducing Electrostatic Discharge (ESD) performance of the device.

19. The semiconductor device of claim 18, wherein the capacitance of the device is below 250 fF and the semiconductor device has an ESD performance of above 15 kV.

\* \* \* \* \*